(12) United States Patent
Kim et al.

(10) Patent No.: US 7,309,622 B2
(45) Date of Patent: Dec. 18, 2007

(54) INTEGRATED CIRCUIT PACKAGE SYSTEM WITH HEAT SINK

(75) Inventors: Minseok Kim, Namyangju-si (KR); Tae Keun Lee, Ichon-si (KR)

(73) Assignee: Stats Chippac Ltd., Singapore (SG)

( * ) Notice: Subject to any disclaimer, the term of this patent is extended or adjusted under 35 U.S.C. 154(b) by 46 days.

(21) Appl. No.: 11/307,350

(22) Filed: Feb. 1, 2006

(65) Prior Publication Data

US 2007/0111397 A1    May 17, 2007

Related U.S. Application Data

(60) Provisional application No. 60/653,013, filed on Feb. 14, 2005.

(51) Int. Cl.
*H01L 21/44* (2006.01)
*H01L 21/48* (2006.01)
*H01L 21/50* (2006.01)

(52) U.S. Cl. ............ 438/106; 438/122; 438/124; 257/E21; 257/499; 257/502; 257/503

(58) Field of Classification Search ............ 438/106, 438/112, 119, 122, 124, 126, 127, 687
See application file for complete search history.

(56) References Cited

U.S. PATENT DOCUMENTS

| 5,233,220 | A | * | 8/1993 | Lamson et al. | ............ 257/666 |
| 5,357,672 | A | * | 10/1994 | Newman | ............ 29/830 |
| 5,455,456 | A | * | 10/1995 | Newman | ............ 257/704 |
| 5,490,324 | A | * | 2/1996 | Newman | ............ 29/830 |
| 6,667,439 | B2 | * | 12/2003 | Salatino et al. | ............ 174/565 |

* cited by examiner

*Primary Examiner*—David Nhu

(57) ABSTRACT

An integrated circuit package system includes providing a substrate. An integrated circuit is attached to the substrate. A plurality of support bars is formed on the substrate. A plurality of adhesive structures is formed. A heat sink is attached to the plurality of adhesive structures. The integrated circuit is encapsulated. The support bars are removed.

8 Claims, 5 Drawing Sheets

INTEGRATED CIRCUIT PACKAGE SYSTEM WITH HEAT SINK

CROSS-REFERENCE TO RELATED APPLICATION(S)

This application claims the benefit of U.S. Provisional Patent Application No. 60/653,013 filed Feb. 14, 2005, and the subject matter thereof is hereby incorporated herein by reference thereto.

The present application contains subject matter related to co-pending U.S. patent application Ser. No. 11/163,559 filed Oct. 22, 2005, by Minseok Kim and Taekeun Lee entitled "INTEGRATED CIRCUIT PACKAGE SYSTEM WITH HEAT SLUG", which claims priority from U.S. Provisional Patent Application No. 60/627,937 filed Nov. 13, 2004. The related application is assigned to STATS ChipPAC Ltd.

TECHNICAL FIELD

The present invention relates generally to integrated circuits, and more particularly to integrated circuits having heat spreaders.

BACKGROUND ART

Recently, there has been rapid development in semiconductor technology and, as a result, semiconductors are becoming smaller, circuitry within semiconductors is becoming increasingly dense to provide higher speeds. As the density increases however, higher power is used in these semiconductor components. Additionally, there is a trend toward combining multiple semiconductors in a single package to form a system-in-a-package or a multi-chip module. As the circuit density increases and multiple semiconductors are placed in one package, heat generation typically increases as well. Thus, heat dissipation is becoming more critical as semiconductor technology develops to address the increasing demand for semiconductors having higher power and speed.

Various techniques may be used to remove or dissipate heat generated by a semiconductor. One such technique involves the use of a mass of conductive material in thermal contact with the semiconductor. The mass of conductive material typically is referred to as a heat spreader. One of the primary purposes of a heat spreader is to absorb and dissipate the heat generated by the electronic circuitry on the semiconductor and to spread the heat away from the semiconductor. The heat spreader thereby removes the heat from the semiconductor and reduces the likelihood of the occurrence of hot spots that can have an adverse effect on the performance and reliability of the semiconductor.

Heat spreaders are made of a thermally conductive material such as aluminum, electro-plated copper, copper alloy, or ceramic, for example. A heat spreader is positioned in thermal contact with a semiconductor by use of a thermally conductive material, such as thermally conductive gels, greases, or solders, as well as to provide thermal conductivity between the semiconductor and the heat spreader.

An electronic device may comprise at least one semiconductor coupled to a heat spreader and a substrate carrier. Passive electronic components such as capacitors also may be attached to the substrate carrier. Typically, the semiconductor is attached to one side of the substrate carrier by means of a number of solder balls, solder bumps, or other alternative connections. The heat spreader may be formed out of a suitable thermally conductive material such as copper, aluminum, carbon composites, or alternative suitable materials. The heat spreader is typically positioned in thermal contact with the semiconductor by means of a thermal adhesive.

Some heat spreaders have a lip around all, or a portion, of the body of the heat spreader. The lip is used to attach the heat spreader to the substrate and to provide structural leg support for the body of the heat spreader around the semiconductor. However, the lip does not contribute significantly to heat dissipation, and may add weight and cost to an electronic device. The lip also occupies space on the substrate that otherwise could be used for placement of additional passive components or semiconductors.

Other heat spreaders have a number of legs that support the body of the heat spreader a distance above the substrate carrier. The distance between the upper surface of the substrate carrier and the lower surface of the body of the heat spreader is referred to herein as the Z-dimension. However, the legs of these heat spreaders utilize substantial portions of the surface area of the substrate carrier that otherwise could be used to carry a larger semiconductor, additional passive components, or additional semiconductors. A need exists for an improved heat spreader design, which does not utilize a significant portion of the substrate carrier for attachment of the heat spreader while maintaining the Z-dimension over the surface of the substrate carrier.

Attaching a heat spreader to the surface of a semiconductor substrate inside of the package often results in solder mask cracking or copper tracer damage during thermal stress testing due to the mismatch of the thermal coefficient of expansion between the heat spreader and the semiconductor substrate.

Additionally, the design of the heat spreader can be very complex resulting in a relatively expensive component for semiconductors that include heat spreaders. The heat spreader to be used also depends upon the size of the semiconductor requiring the manufacture and storage of a variety of sizes of heat spreaders.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system that includes providing a substrate. An integrated circuit is attached to the substrate. A plurality of support bars is formed on the substrate. A plurality of support bars is formed on the substrate. A plurality of adhesive structures is formed. A heat sink is attached to the plurality of adhesive structures. The integrated circuit is encapsulated. The support bars are removed.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings are semi-diagrammatic and not to scale and, particularly, some of the dimensions are for the clarity of presentation and are shown greatly exaggerated in the FIGS.

The term "horizontal" as used herein is defined as a plane parallel to the conventional plane or surface of the substrate, regardless of its orientation. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane.

The term "processing" as used herein includes deposition of material or photoresist, patterning, exposure, development, etching, cleaning, and/or removal of the material or photoresist as required in forming a described structure.

Figure 1:
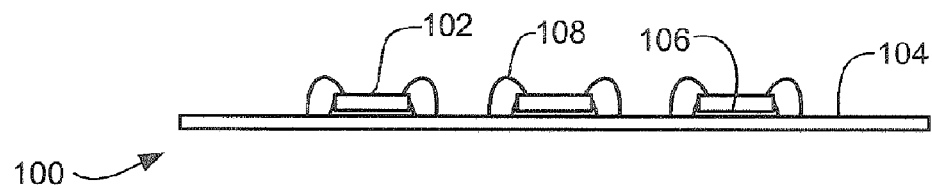
FIG. 1 is a cross-sectional view of an array of semiconductor packages having integrated circuits attached to a substrate in an intermediate stage of stage of manufacturing in accordance with an embodiment of the present invention.

Referring now to FIG. 1, therein is shown a cross-sectional view of an array of semiconductor packages 100 having a number of integrated circuits 102 attached to a substrate 104 in an intermediate stage of stage of manufacturing in accordance with an embodiment of the present invention. The substrate, such as a printed circuit board (PCB), is processed to form a pattern of conductive lines to which the integrated circuits are electrically connected. The integrated circuits are attached to the substrate using an adhesive layer 106. The integrated circuits 102 are connected to the substrate by a number of wires 108, such as by wire bonding. There is thus formed a spaced array of integrated circuits 102 attached and electrically connected to the substrate.

Figure 2:
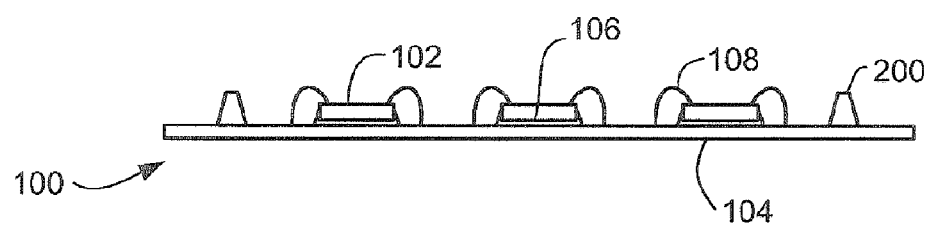
FIG. 2 is the structure of FIG. 1 after forming a number of support bars on the substrate.

Referring now to FIG. 2, therein is shown the structure of FIG. 1 after forming a number of support bars 200 on the substrate. The support bars 200 can be formed in any suitable manner and attached to the substrate 104. It has been discovered, however, that the support bars 200 can be formed of an adhesive material that is applied using conventional adhesive application equipment readily available in the semiconductor industry using a dotting process. The adhesive material typically is allowed to cure to provide some rigidity to the support bars 200.

Preferably, the material used to form the support bars 200 has elastic characteristics and a high aspect ratio. The elasticity of the material used for the support bars 200 reduces the mechanical stress when a heat slug is attached as described below. The high aspect ratio decreases the area required between the integrated circuits 102 and the edge of the encapsulant when formed. Materials suitable to form the support bars 200 include epoxy resin, film, and solder.

The support bars 200 have a height equal to or greater than that of the integrated circuits 104 and their associated wires 108. The support bars 200 are positioned outside the electrically active area of the substrate 104 to avoid interfering with the electrical connections between the integrated circuits 102 and the processed portion of the substrate 102.

Figure 3:
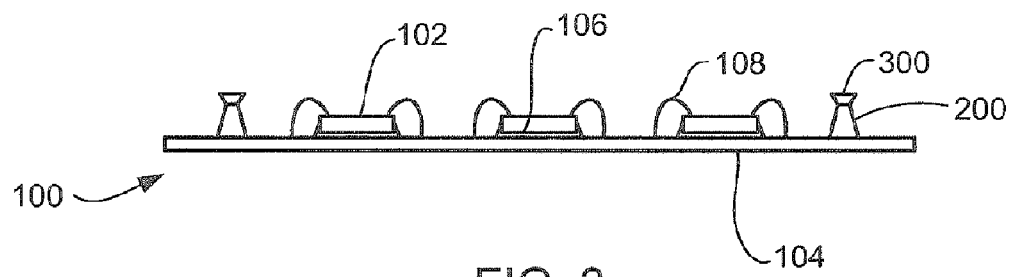
FIG. 3 is the structure of FIG. 2 after providing an adhesive on the support bars.

Referring now to FIG. 3, therein is shown the structure of FIG. 2 after providing a plurality of adhesive structures 300 on the support bars 200. The adhesive structures 300 are applied to the upper tips of the support bars 200 using an adhesive dotting process on conventional adhesive application equipment readily available in the semiconductor industry.

Figure 4:
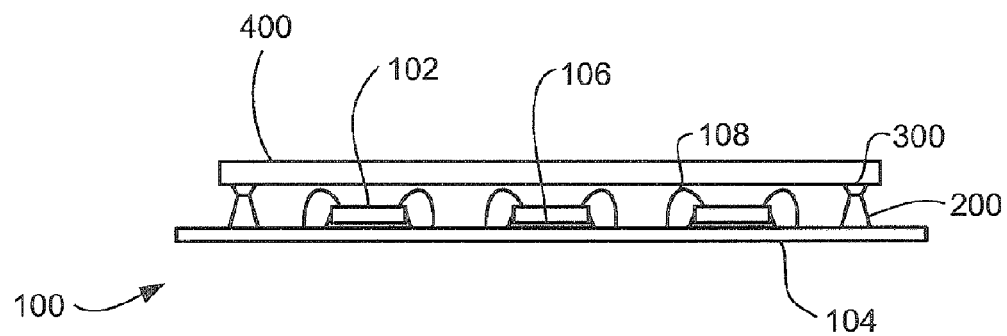
FIG. 4 is the structure of FIG. 3 after a heat slug has been attached to the support bars.

Referring now to FIG. 4, therein is shown the structure of FIG. 3 after a heat slug 400 has been attached to the support bars 200 using the adhesive structures 300. The heat slug 400 is a strip-type of thermally conductive material having a much higher thermal conductivity than the molding compound used to encapsulate the integrated circuits as described below. Preferably, the heat slug 400 forms a continuous layer across the integrated circuits 102.

Figure 5:
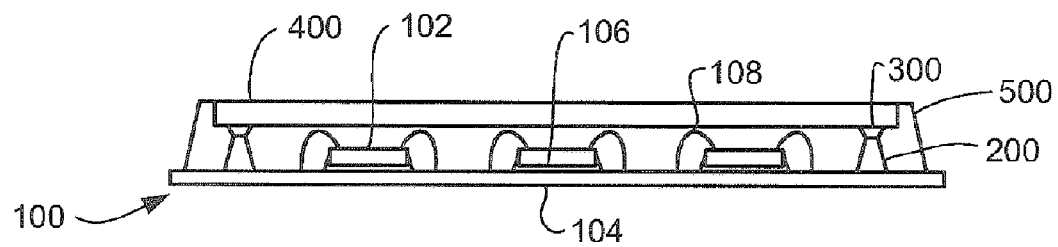
FIG. 5 is the structure of FIG. 4 after encapsulating the integrated circuits.

Referring now to FIG. 5, therein is shown the structure of FIG. 4 after encapsulating the integrated circuits 102. The integrated circuits 102 are encapsulated using a suitable molding compound 500, such as an epoxy. The molding compound 500 also encapsulates the support bars 200. After the molding compound 500 has cured the encapsulated structure can be marked using conventional marking equipment used in the semiconductor industry.

Figure 6:
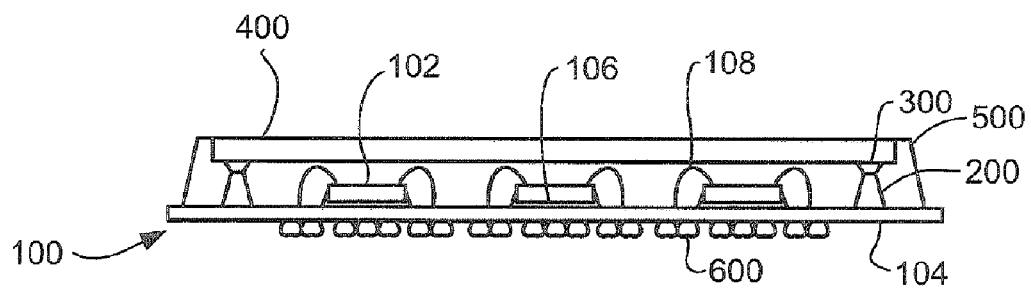
FIG. 6 is the structure of FIG. 5 after attaching a number of solder balls to the lower surface of the substrate.

Referring now to FIG. 6, therein is shown the structure of FIG. 5 after attaching a number of solder balls 600 to the lower surface of the substrate 104. The solder balls 600 are attached to a number of contacts (not shown) on the lower surface of the substrate 104.

Figure 7:
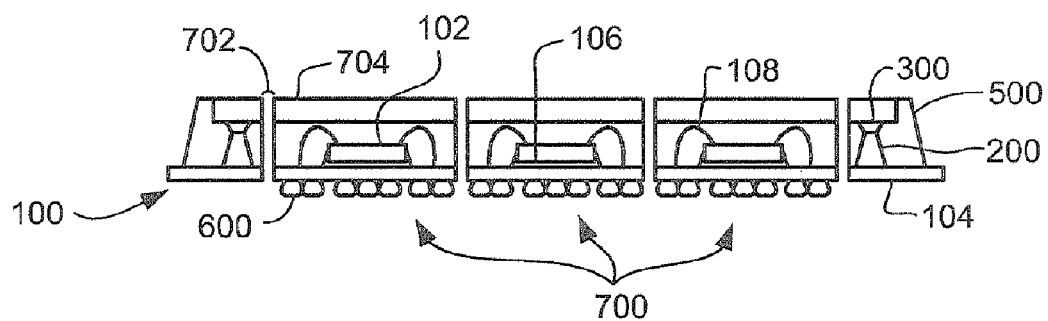
FIG. 7 is the structure of FIG. 6 after singulating the encapsulated integrated circuits.

Referring now to FIG. 7, therein is shown the structure of FIG. 6 after singulating the encapsulated integrated circuits 102. Singulation of the encapsulated integrated circuits 102 at a singulation region 702 uses a suitable cutting tool, such as a saw blade or laser, to cut through the heat slug 400, the molding compound 500, and the substrate 104. As a result of the singulation process, the support bars 200 are removed from the structure, and disposed.

There are thus formed a number of integrated circuit package systems 700 that each have a heat sink 704 formed from the heat slug 400. The heat sinks 704 float above the integrated circuits 102, and preferably have surfaces that are exposed to the environment outside the molding compound 500 thereby enhancing the heat transfer from the integrated circuit package systems 700 during operation. The heat sinks 704 are supported by the molding compound 500 between the integrated circuits 102 and the bottom surface of the heat sinks 704. There are no legs or other supports for the heat sinks 704, which occupy space on the substrate within the integrated circuit package systems 700.

Figure 8:
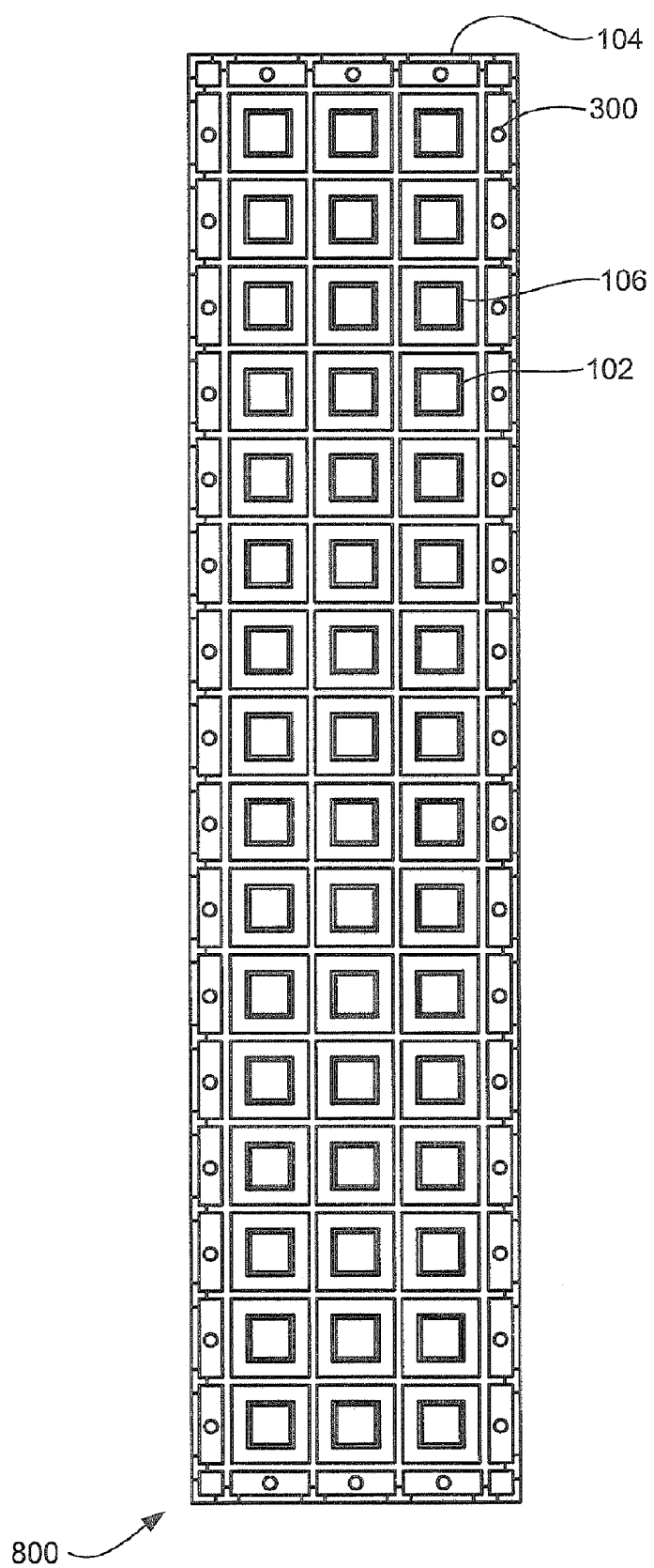
FIG. 8 is a plan view of an array of integrated circuits before encapsulation and singulation.

Referring now to FIG. 8, therein is shown a plan view of an array 800 of integrated circuits 102 before encapsulation and singulation. The array 800 includes the substrate 104. The integrated circuits 102 are attached to the substrate 104 using the adhesive layer 106. The support bars 200 shown in FIGS. 2-7 and the adhesive structures 300 are formed around the outer edges of the substrate 104 outside the electrically active area of the integrated circuits 102.

Figure 9:
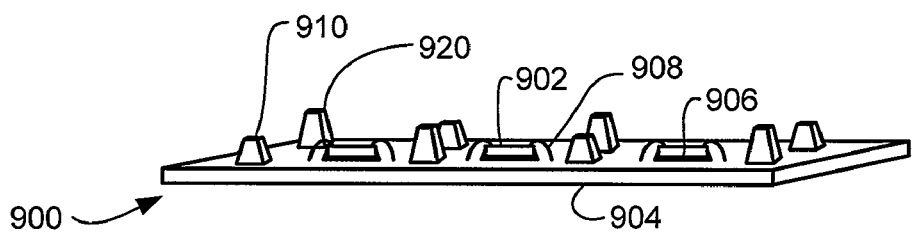
FIG. 9 is a schematic isometric view of an array of an array of semiconductor packages having integrated circuits attached to a substrate with a number of support bars in an intermediate stage of manufacture in accordance with an embodiment of the present invention.

FIG. 9 is an isometric view of an array of an array of semiconductor packages 900 having integrated circuits 902 attached to a substrate 904 in an intermediate stage of manufacture in accordance with an embodiment of the present invention. The substrate 904, such as a printed circuit board (PCB), is processed to form a pattern of conductive lines to which the integrated circuits 902 are electrically connected. The integrated circuits are attached to the substrate using an adhesive layer 906. The integrated circuits 902 are connected to the substrate by a number of wires 908, such as by wire bonding. There is thus formed a spaced array of integrated circuits 902 attached and electrically connected to the substrate.

A number of support bars 910 can be formed in any suitable manner and attached to the substrate 904. It has been discovered, however, that the support bars 910 can be formed of an adhesive material that is applied using conventional adhesive application equipment readily available in the semiconductor industry using a dotting process. The adhesive material typically is allowed to cure to provide some rigidity to the support bars 910.

Preferably, the material used to form the support bars 910 has elastic characteristics and a high aspect ratio. The elasticity of the material used for the support bars 910 reduces the mechanical stress when a heat slug is attached as described below. The high aspect ratio decreases the area required between the integrated circuits 902 and the edge of the encapsulant when formed.

The support bars 910 have a height equal to or greater than that of the integrated circuits 902 and their associate wires 908. The support bars 910 are positioned outside the electrically active area of the substrate 904 to avoid interfering with the electrical connections between the integrated circuits 902 and the processed portion of the substrate 904.

A number of adhesive structures 920 are applied to the substrate 904 using conventional adhesive application equipment readily available in the semiconductor industry using a dotting process. The adhesive structures 920 preferably extend higher than the height of the support bars 910 to allow for compression of the adhesive structures 920 due to attachment of the heat slug as described below.

Figure 10:
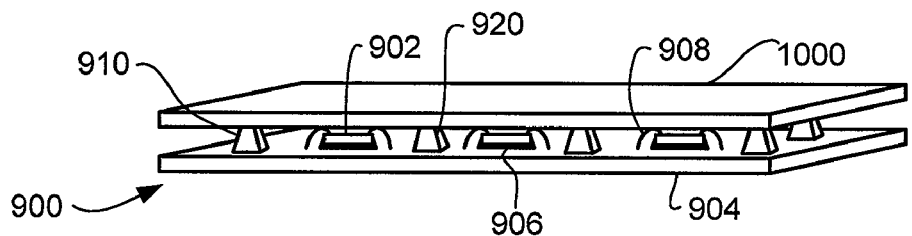
FIG. 10 is the structure of FIG. 9 after a heat slug has been attached to the support bars.

Referring now to FIG. 10, therein is shown the structure of FIG. 9 after a heat slug 1000 has been attached to the support bars 910 and the adhesive structures 920. The heat slug 1000 is a strip-type of thermally conductive material having a much higher thermal conductivity than the molding compound used to encapsulate the integrated circuits as described below. Preferably, the heat slug 1000 forms a continuous layer over the integrated circuits 902.

Figure 11:
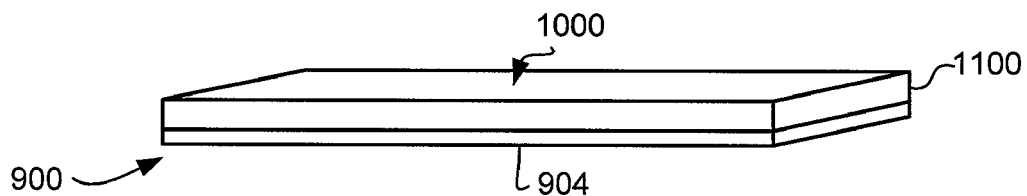
FIG. 11 is the structure of FIG. 10 after encapsulating the integrated circuits.

Referring now to FIG. 11, therein is shown the structure of FIG. 10 after encapsulating the integrated circuits 902. The integrated circuits 902 are encapsulated using a suitable molding compound 1100, such as an epoxy. The molding compound 1100 also encapsulates the support bars 910 and the adhesive structures 920. The upper surface of the heat slug 1000 is exposed through the molding compound 1100. After the molding compound 1100 has cured the encapsulated structure can be marked using conventional marking equipment used in the semiconductor industry.

Figure 12:
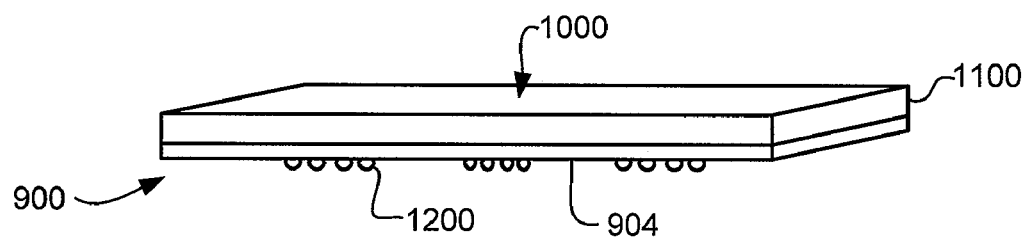
FIG. 12 is the structure of FIG. 11 after attaching a number of solder balls to the lower surface of the substrate.

Referring now to FIG. 12, therein is shown the structure of FIG. 11 after attaching a number of solder balls 1200 to the lower surface of the substrate 904. The solder balls 1200 are attached to a number of contacts (not shown) on the lower surface of the substrate 904.

Figure 13:
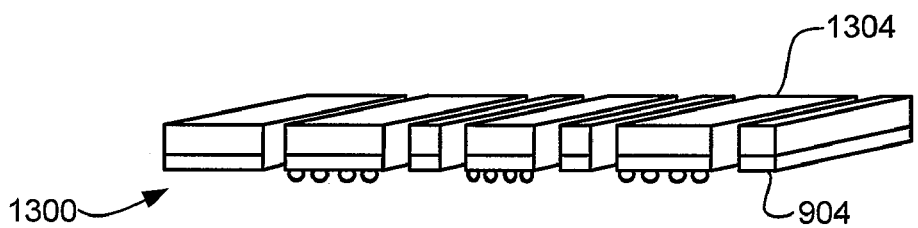
FIG. 13 is the structure of FIG. 12 after singulating the encapsulated integrated circuits.

Referring now to FIG. 13, therein is shown the structure of FIG. 12 after singulating the encapsulated integrated circuits 902 shown in FIGS. 9 and 10 above. Singulation of the encapsulated integrated circuits 902 uses a suitable cutting tool, such as a saw blade or laser, to cut through the heat slug 1000, the molding compound 1100, and the substrate 904. As a result of the singulation process, the support bars 910 and the adhesive structures 920 shown in FIGS. 9 and 10 are removed from the structure, and disposed.

There are thus formed a number of semiconductor packages 1300 that each have a heat sink 1304 formed from the heat slug 1000. The heat sinks 1304 float above the integrated circuits 902 shown in FIGS. 9 and 10, and preferably have surfaces that are exposed to the environment outside the molding compound 1100 thereby enhancing the heat transfer from the semiconductor packages 1300 during operation. The heat sinks 1304 are supported by the molding compound 1100 between the integrated circuits 902 and the bottom surface of the heat sinks 1304. There are no legs or other support bars for the heat sinks 1304, which occupy space on the substrate 904 within the semiconductor packages 1300.

Figure 14:
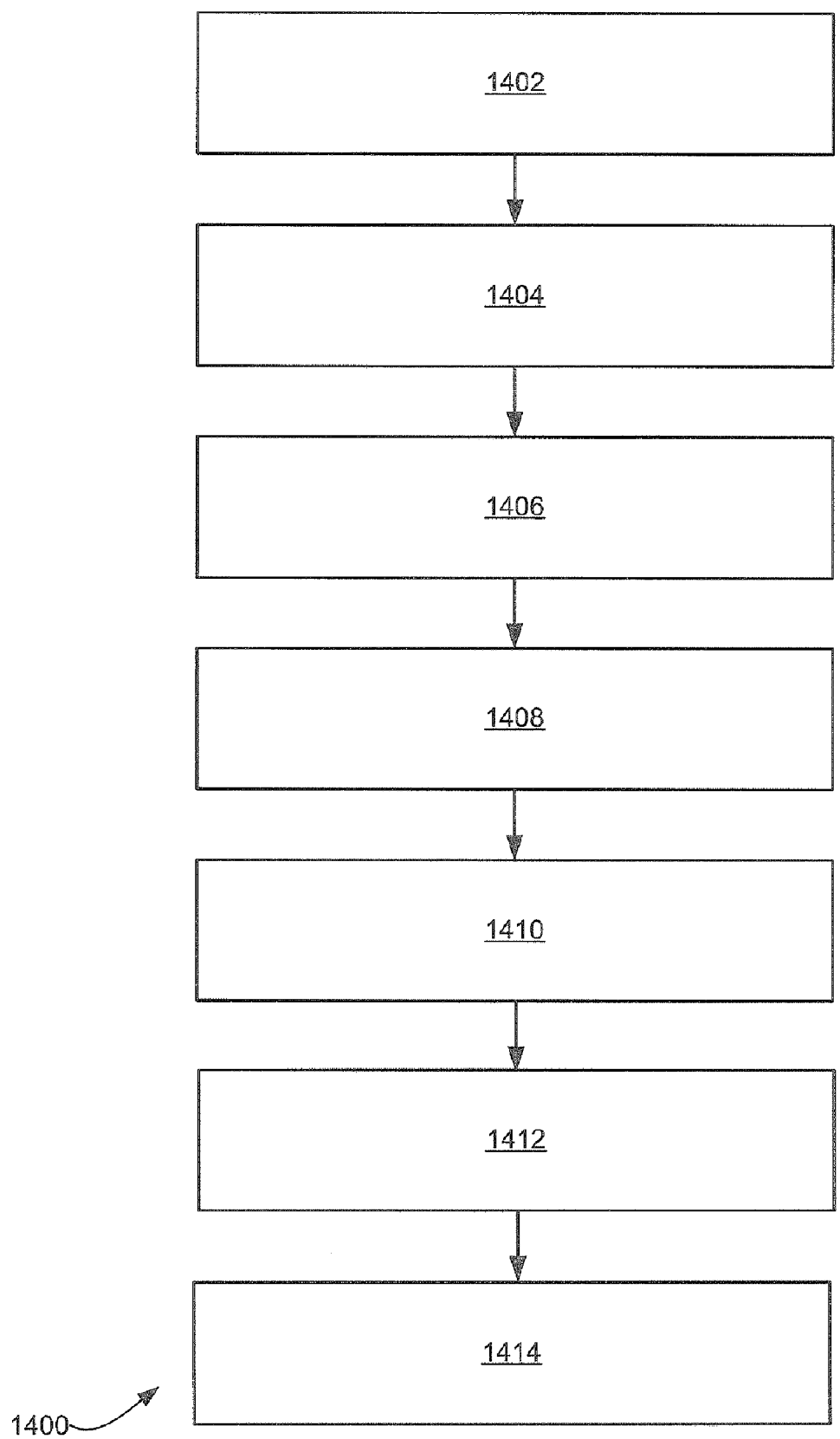
FIG. 14 is a flow chart of an integrated circuit package system for manufacturing a semiconductor package in accordance with the present invention.

Referring now to FIG. 14, therein is shown a flow chart of an integrated circuit package system 1400 for packaging integrated circuits in accordance with the present invention. The system 1400 includes providing a substrate in a block 1402; attaching an integrated circuit to the substrate in a block 1404; forming a plurality of support bars on the substrate in a block 1406; forming a plurality of adhesive structures in a block 1408; attaching a heat slug to the plurality of adhesive structures in a block 1410; encapsulating the integrated circuit in a block 1412; and removing the support bars in a block 1414.

Thus, it has been discovered that the integrated circuit package system of the present invention furnishes important and heretofore unavailable solutions, capabilities, and functional advantages for packaging semiconductors with heat sinks. The system of the present invention is not dependent upon the size of the integrated circuits used thereby avoiding the necessity of manufacturing and storing heat sinks of different sizes. The system of the present invention can use a relatively thin, flat heat slug. The resulting process and configurations are straightforward, economical, uncomplicated, highly versatile and effective, use conventional technologies, and are thus readily suited for manufacturing semiconductor packages that are fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

What is claimed is:

1. An integrated circuit package system comprising:
   providing a substrate;
   attaching an integrated circuit to the substrate;
   forming a plurality of support bars on the substrate wherein forming the plurality of support bars on the substrate forms support bars having a height higher than the height of the integrated circuit;
   forming a plurality of adhesive structures;
   attaching a heat slug to the plurality of adhesive structures;
   encapsulating the integrated circuit; and
   removing the support bars.

2. The system for packaging integrated circuits as claimed in claim 1, wherein forming a plurality of support bars on the substrate forms a plurality of adhesive dots.

3. The system for packaging integrated circuits as claimed in claim 1, wherein:
   forming a plurality of adhesive structures forms a plurality of adhesive dots on the plurality of support bars.

4. The system for packaging integrated circuits as claimed in claim 1, wherein forming a plurality of adhesive structures forms a plurality of adhesive dots having a height higher than the height of the plurality of support bars.

5. An integrated circuit package system comprising:
   providing a substrate;
   attaching a plurality of integrated circuits to the substrate to form an array of integrated circuits;
   forming a plurality of support bars around outer edges of the array of integrated circuits wherein forming the plurality of support bars on the substrate forms support bars having a height higher than the height of the array of integrated circuits;
   forming a plurality of adhesive structures;
   attaching a heat slug to the plurality of adhesive structures over the array of integrated circuits;
   encapsulating the array of integrated circuits and the support bars to form an array of packaged integrated circuits; and
   singulating the array of integrated circuits to form packaged integrated circuits having a heat sink above the integrated circuit above the array of integrated circuits and exposed through the encapsulant.

6. The system for packaging integrated circuits as claimed in claim 5, wherein forming a plurality of support bars on the substrate forms a plurality of adhesive dots.

7. The system for packaging integrated circuits as claimed in claim 5, wherein:
   forming a plurality of adhesive structures forms a plurality of adhesive structures on the plurality of support bars.

8. The system for packaging integrated circuits as claimed in claim 5, wherein forming a plurality of adhesive structures forms a plurality of adhesive dots having a height higher than the height of the plurality of support bars.

* * * * *

UNITED STATES PATENT AND TRADEMARK OFFICE
CERTIFICATE OF CORRECTION

PATENT NO.         : 7,309,622 B2                                              Page 1 of 1
APPLICATION NO.    : 11/307350
DATED              : December 18, 2007
INVENTOR(S)        : Kim et al.

It is certified that error appears in the above-identified patent and that said Letters Patent is hereby corrected as shown below:

Column 8,

Line 14 and line 15, delete "a heat sink above the integrated circuit above the array" and insert therefore --a heat sink above the array--

Signed and Sealed this

Twenty-ninth Day of April, 2008

JON W. DUDAS
*Director of the United States Patent and Trademark Office*